(12) United States Patent
Hirano

(10) Patent No.: US 6,264,706 B1
(45) Date of Patent: Jul. 24, 2001

(54) SUBSTRATE PROCESSING APPARATUS WITH LOCAL EXHAUST FOR REMOVING CONTAMINANTS

(75) Inventor: Mitsuhiro Hirano, Tokyo (JP)

(73) Assignee: Kokusai Electric Co., Ltd., Tokyo (JP)

( * ) Notice: Subject to any disclaimer, the term of this patent is extended or adjusted under 35 U.S.C. 154(b) by 0 days.

(21) Appl. No.: 09/510,173

(22) Filed: Feb. 22, 2000

Related U.S. Application Data

(62) Division of application No. 08/813,200, filed on Mar. 7, 1997.

(30) Foreign Application Priority Data

Mar. 8, 1996 (JP) .......................................... 8-80966

(51) Int. Cl.[7] .............................. H01L 21/00; H01L 21/66
(52) U.S. Cl. ............................................................ 29/25.01
(58) Field of Search ................................................ 29/25.01

(56) References Cited

U.S. PATENT DOCUMENTS

| | | |
|---|---|---|
| 4,990,047 | * 2/1991 | Wagner et al. . |
| 5,162,047 | * 11/1992 | Wada et al. . |
| 5,223,001 | 6/1993 | Saeki . |
| 5,277,215 | 1/1994 | Yanagawa et al. . |
| 5,303,482 | 4/1994 | Yamashita et al. . |
| 5,445,491 | 8/1995 | Nakagawa et al. . |
| 5,697,749 | 12/1997 | Iwabuchi et al. . |

FOREIGN PATENT DOCUMENTS

| | | |
|---|---|---|
| 61-203290 | 9/1986 | (JP) . |
| 62-068294 | 3/1987 | (JP) . |
| 62-098740 | 5/1987 | (JP) . |
| 62676 U | 1/1994 | (JP) . |

* cited by examiner

*Primary Examiner*—David E. Graybill

(57) ABSTRACT

A substrate processing apparatus comprises a substrate processing chamber for processing a substrate, a load lock chamber, a gas supply line for supplying gas into the load lock chamber, exhaust lines for exhausting the load lock chamber, a moving mechanism provided in the load lock chamber and capable of moving the substrate, local exhaust lines capable of locally exhausting dust generating portions of the moving mechanism, a flow rate controlling device provided in the gas supply line and flow rate controlling devices provided in the local exhaust lines. The flow rates of the flow rate controlling devices are monitored and controlled to control the inside pressure of the load lock chamber to be slightly higher than the atmosphere pressure, thereby preventing the backward flow from the vent line.

18 Claims, 5 Drawing Sheets

SUBSTRATE PROCESSING APPARATUS WITH LOCAL EXHAUST FOR REMOVING CONTAMINANTS

This application is a divisional of co-pending application Ser. No. 08/813,200, filed on Mar. 7, 1997, the entire contents of which are hereby incorporated by reference.

BACKGROUND OF THE INVENTION

1. Field of the Invention

The present invention relates to a substrate processing apparatus, and more particularly, to a substrate processing apparatus for manufacturing a semiconductor device or a liquid crystal display device.

2. Description of the Related Art

In many of the conventional substrate processing apparatus of this type, there is provided a load lock chamber which is connected to a substrate processing chamber. In such a load lock chamber, a moving mechanism for moving substrates which are to be processed, such as semiconductor wafers or glass substrates, is generally provided.

However, with the substrate processing apparatus including a load lock chamber provided with a moving mechanism therein, there is a problem that semiconductor wafers, glass substrates or the like are contaminated by particles generated from the moving mechanism.

SUMMARY OF THE INVENTION

It is, therefore, a main object of the present invention to solve the problem that particles generated from the moving mechanism contaminate substrates such as semiconductor wafers, in the load lock chamber provided with the moving mechanism therein, and to provide a substrate processing apparatus having a load lock chamber in which a highly cleaned region can be formed.

According to a first aspect of the present invention, there is provided a substrate processing apparatus, comprising:
  a substrate processing chamber for processing a substrate;
  a load lock chamber;
  gas supply means for supplying gas into the load lock chamber;
  exhaust means for exhausting the load lock chamber;
  a moving mechanism provided in the load lock chamber and capable of moving the substrate;
  local exhaust means capable of locally exhausting a dust generating portion of the moving mechanism; and
  a flow rate controlling device provided in at least one of the gas supply means, the exhaust means and the local exhaust means.

According to a second aspect of the present invention, there is provided a substrate processing apparatus, comprising:
  a substrate processing chamber for processing a substrate;
  a load lock chamber;
  gas supply means for supplying gas into the load lock chamber;
  exhaust means for exhausting the load lock chamber;
  a moving mechanism provided within the load lock chamber and capable of moving the substrate;
  local exhaust means capable of locally exhausting a dust generating portion of the moving mechanism; and
  a flow rate measuring device for measuring an exhaust amount of the local exhaust means.

According to a third aspect of the present invention, there is provided a substrate processing apparatus, comprising:
  a substrate processing chamber for processing a substrate;
  a load lock chamber;
  gas supply means for supplying gas into the load lock chamber;
  exhaust means for exhausting the load lock chamber;
  a moving mechanism provided within the load lock chamber and capable of moving the substrate;
  a first vacuum exhaust line to be connected to a vacuum pump;
  a second vacuum exhaust line which is communicated with the substrate processing chamber and the first vacuum exhaust line;
  local exhaust means which is capable of locally exhausting a dust generating portion of the moving mechanism, and is communicated with the first vacuum exhaust line;
  a valve connected to an intermediate portion of the local exhaust means; and
  control means capable of controlling the valve;
  wherein during processing of the substrate in the substrate processing chamber, the control means controls the valve to be closed.

According to a fourth aspect of the present invention, there is provided a substrate processing method, using a substrate processing apparatus comprising:
  a substrate processing chamber for processing a substrate;
  a load lock chamber;
  gas supply means for supplying gas into the load lock chamber;
  exhaust means for exhausting the load lock chamber;
  a moving mechanism provided within the load lock chamber and capable of moving the substrate;
  local exhaust means capable of locally exhausting a dust generating portion of the moving mechanism; and
  a flow rate control device provided in at least one of the gas supply means, the exhaust means and the local exhaust means;
  the substrate processing method comprising the steps of:
  moving the substrate by utilizing the moving mechanism, while controlling pressure within the load lock chamber by supplying gas into the load lock chamber by the gas supply means, locally exhausting the dust generating portion by the local exhaust means, exhausting the gas within the load lock chamber by the exhaust means, and controlling flow rate of at least one of the gas supply means, the exhaust means and the local exhaust means by means of the flow rate control device; and
  processing the substrate in the substrate processing chamber.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS

Figure 1:
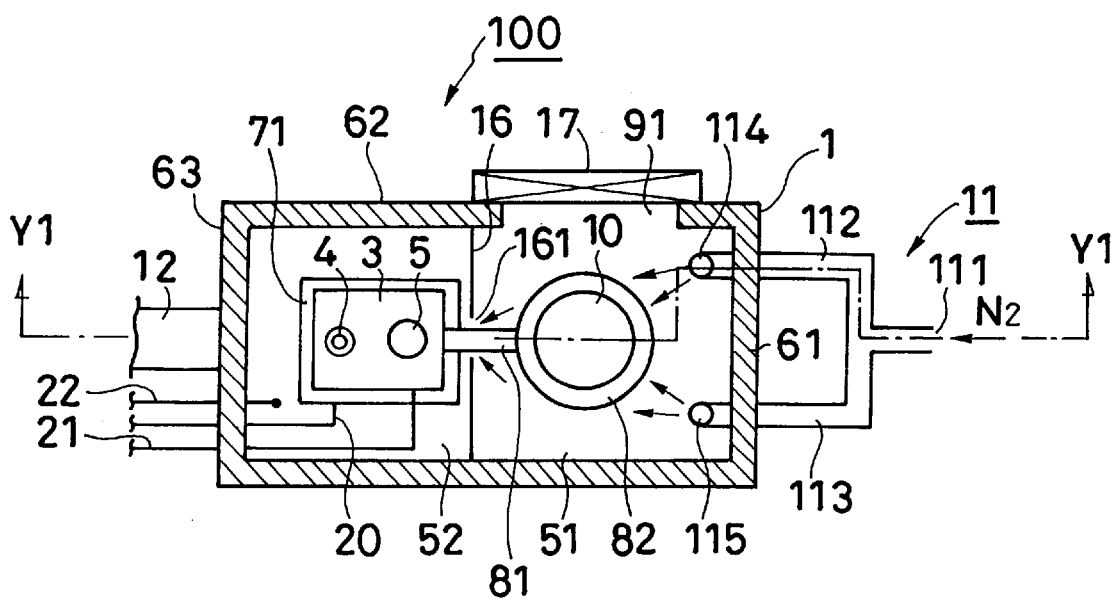
FIG. 1 is a transverse sectional view, taken along the line X1—X1 of FIG. 2, for explaining a semiconductor manufacturing apparatus according to one embodiment of the present invention.
Figure 2:
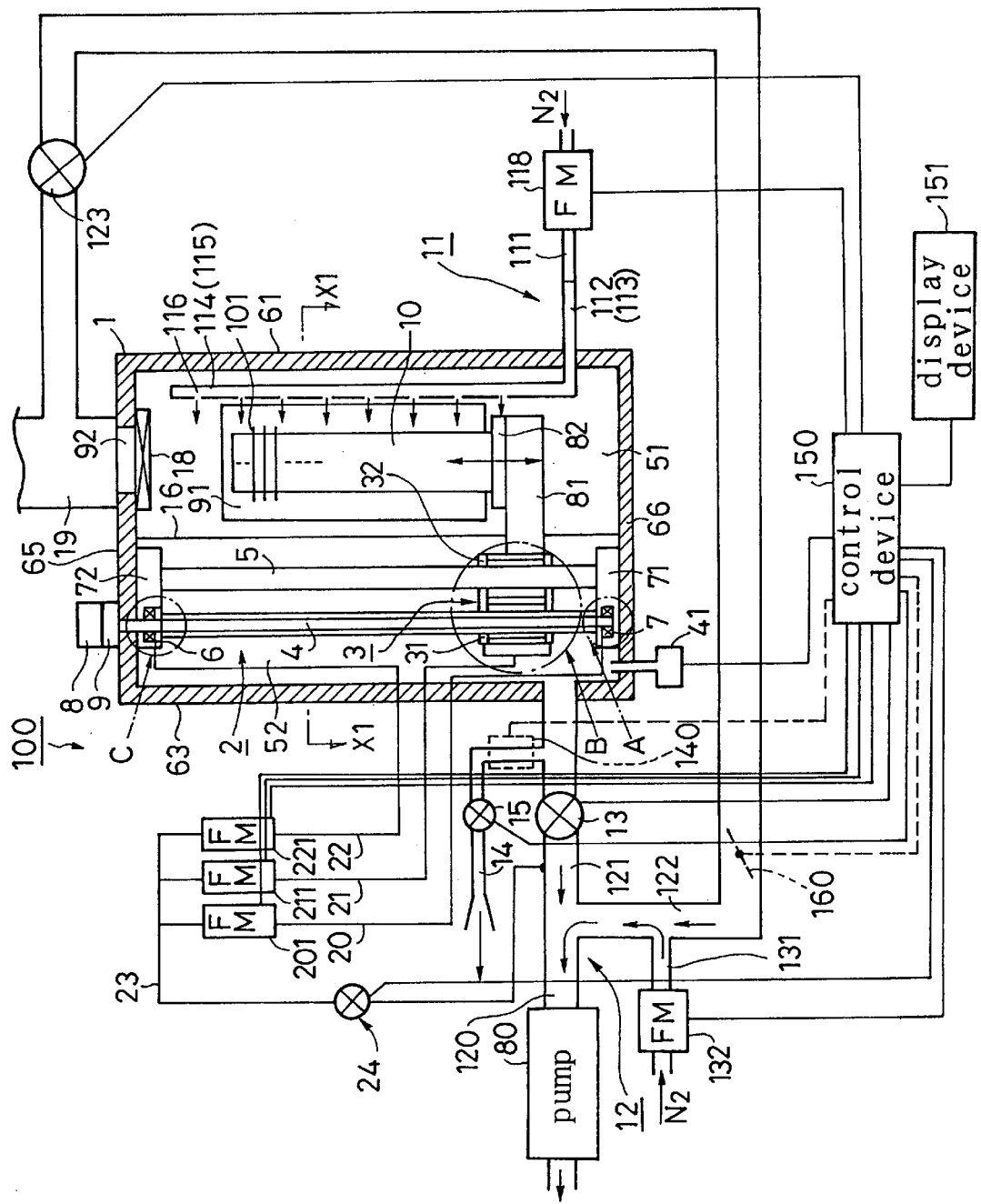
FIG. 2 is a longitudinal sectional view, taken along the line Y1—Y1 of FIG. 1, for explaining the semiconductor manufacturing apparatus according to the one embodiment of the invention.

Referring to FIG. 1, the semiconductor manufacturing apparatus 100 includes a load lock chamber 1 far accommodating a boat 10 for mounting semiconductor wafers 101 such as Si wafers. The semiconductor manufacturing apparatus 100 is also provided, within the load lock chamber 1, with a moving mechanism 2 for lifting or lowering the boat 10. A partition plate 16 is provided within the load lock chamber 1 for dividing the load lock chamber 1 into a moving mechanism chamber 52 for accommodating the moving mechanism 2 and a boat chamber 51 for accommodating the boat 10.

A side wall 62 of the load lock chamber 1 is provided, at the side of the boat chamber 51, with an opening 91, and a gate valve 17 is attached to the opening 91. The wafers 101 are mounted on or removed from the boat 10 through the opening 91 and the gate valve 17. A reaction oven 19 for forming a film on the wafers 101 is provided on the load lock chamber 1. A ceiling wall between the reaction oven 19 and the boat chamber 51 is provided with an opening 92 to which a gate valve 18 is attached. The boat 10 is introduced from the load lock chamber 1 into the reaction oven 19 and taken out from the reaction oven 19 though the opening 92 and the gate valve 18.

The boat 10 is vertically moved up and down by means of the moving mechanism 2. The moving mechanism 2 is mainly composed of a moving block 3, a ball screw 4, a guide 5, bearings 6, 7, a motor 8 and a magnetic seal unit 9. The ball screw 4 and the guide 5 are vertically provided between a base 71 attached to a bottom wall 66 and a base 72 attached to a ceiling wall 65. A lower end of the ball screw 4 is rotatably supported by the bearing 7 mounted within the base 71, and an upper end of the ball screw 4 is rotatably supported by the bearing 6 mounted within the base 72. The upper tip end of the ball screw 4 is attached to the magnetic seal unit 9. The ball screw 4 is rotated by the motor 8 through the magnetic seal unit 9. When the ball screw 4 is rotated, the moving block 3 and a nut (bearing) 31 meshed with the ball screw 4 are lifted or lowered, thereby lifting or lowering an arm 81 attached to the moving block 3, and also lifting or lowering the boat 10. The boat 10 is placed on a boat mounting portion 82 mounted on the arm 81. The arm 81 is provided so as to horizontally pass through a slit 161 which is vertically provided in the partition plate 16 at its central position. The moving block 3 is also provided with a nut (bearing) 32 in addition to the nut 31, and the nut 32 cooperates with the guide 5 to guide a vertical movement of the moving block 3.

An $N_2$ gas supply line 11 is connected to the load lock chamber 1 at the side of the side wall 61. The $N_2$ gas supply line 11 includes $N_2$ gas supply pipes 111 to 115. The $N_2$ gas supply line 111 branches into the two horizontal $N_2$ gas supply pipes 112 and 113, which are passed through the side wall 61 and then are communicated with the vertical $N_2$ gas supply pipes 114 and 115. Each of the $N_2$ gas supply pipes 114 and 115 is provided with a plurality of holes 116 arranged in a vertical direction. The $N_2$ gas supply pipe 111 is provided, at its intermediate portion, with a flow meter 118 so that a supply amount of $N_2$ gas can be adjusted.

$N_2$ gas is supplied, from the plurality of the holes 116 which are vertically arranged in the $N_2$ gas supply pipes 114 and 115 of the $N_2$ gas supply line 11, toward the boat 10 and the wafer 101 in a manner of shower, and then is flowed into the moving mechanism chamber 52 through the slit 161 provided in the partition plate 16. The $N_2$ gas is then exhausted from local exhaust lines 20, 21 and 22 which are in communication with the moving mechanism chamber 52, and from an atmospheric pressure vent line 14. In this manner, the gas supply line is connected to a region in which the wafers 101 which are to be moved are transferred in or out and moves, and the exhaust line is connected to a region in which the moving mechanism is disposed, thereby keeping the region in which the wafers 101 move in a cleaner state.

A vacuum exhaust line 121 passes through the side wall 63 of the load lock chamber 1. The vacuum exhaust line 121 is provided, at its intermediate portion, with an air valve 13. The air valve 13 of the vacuum exhaust line 121 is provided, at its upstream portion, with the atmospheric pressure vent line 14. Level of pressure at a tip end of the atmospheric pressure vent line 14 is substantially atmospheric pressure. The atmospheric pressure vent line 14 is provided, at its intermediate portion, with an air valve 15. Air exhaust is changed over between the vacuum exhaust line 121 and the atmospheric pressure vent line 14 by the air valves 13 and 15.

The vacuum exhaust line 121 is connected to the vacuum exhaust line 120, and a vacuum pump 80 is connected to the vacuum exhaust line 120. One end of the vacuum exhaust line 122 is connected to an intermediate portion of the vacuum exhaust line 120, and the other end of the vacuum exhaust line 122 is connected to the reaction oven 19. An $N_2$ ballast piping is connected to an intermediate portion of the vacuum exhaust line 122. The $N_2$ ballast piping 131 is provided, at its intermediate portion, with a flow meter 132 so that a supply amount of $N_2$ gas to the $N_2$ ballast piping 131 can be adjusted. A vacuum exhaust line 122, upstream the $N_2$ ballast piping 131, is provided with an air valve 123.

A pressure gauge 41 is passed through the bottom wall 66 of the load lock chamber 1 and communicated with the inside of the moving mechanism chamber 52, so that pressure within the load lock chamber 1, especially within the moving mechanism chamber 52 can be measured.

The local exhaust lines 20, 21 and 22 are provided for respectively locally gas-exhausting portions in which there exist the bearing 7, the moving block 3 and the bearing 6. Flow meters 201, 211 and 221 are respectively connected to the local exhaust lines 20, 21 and 22, so that local exhaust amounts can be adjusted and measured respectively. At downstream of the flow meters 201, 211 and 211, the local exhaust lines 20, 21 and 22 are converged into a single local exhaust line 23, and a tip end of the line 23 is connected to the vacuum exhaust line 121 in the rear (downstream) of the air valve 13. The local exhaust line 23 is provided at its intermediate portion with an air valve 24 for turning ON/OFF of air exhausting. The local exhaust lines 20. 21 and 22 comprise Teflon tubes.

The air valves 13, 15, 24, 123, the flow meters 118, 132, 201, 211, 221, and the pressure gauge 41 are connected to a control device 150. A display device 151 is connected to the control device 150 for displaying flow rate information from the flow meters 118, 132, 201, 211 and 221, as well as pressure information from the pressure gauge 41.

Figure 3:
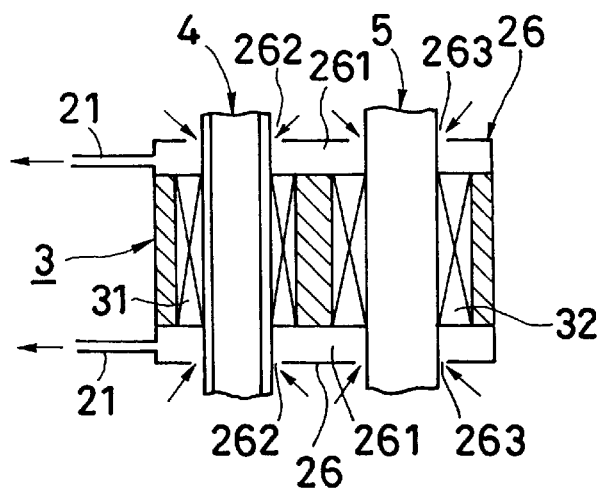
FIG. 3 is an enlarged longitudinal sectional view of Part B in FIG. 2.

As is shown in FIG. 3, a cover 26 is provided for covering the moving block 3, and the local exhaust line 21 is communicated with a space 261 covered with the cover 26. A clearance 262 is defined between the cover 26 and the ball screw 4, and a clearance 263 is defined between the cover 26 and the guide 5. $N_2$ gas within the load lock chamber 1 is flowed into the space 261 covered with the cover 26 through these clearances 262 and 263, and is exhausted through the local exhaust line 21.

Figure 4:
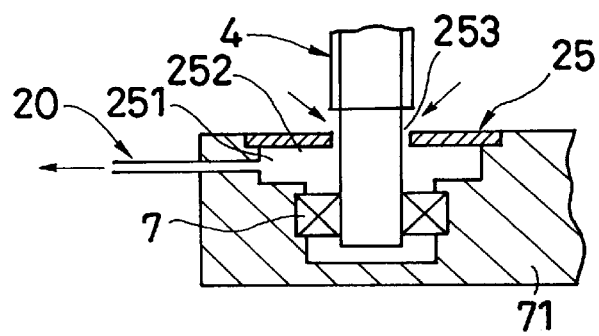
FIG. 4 is an enlarged longitudinal sectional view of Part A in FIG. 2.

As is shown in FIG. 4, the base 71 is formed with a concavity 251 within which the bearing 7 is mounted. The base 71 is provided, at the side of opening end of the concavity 251, with a cover 25 for covering the concavity 251 and the bearing 7. The local exhaust line 20 is communicated with a space 252 covered with the cover 25. A clearance 253 is defined between the cover 25 and the ball screw 4.

Figure 5:
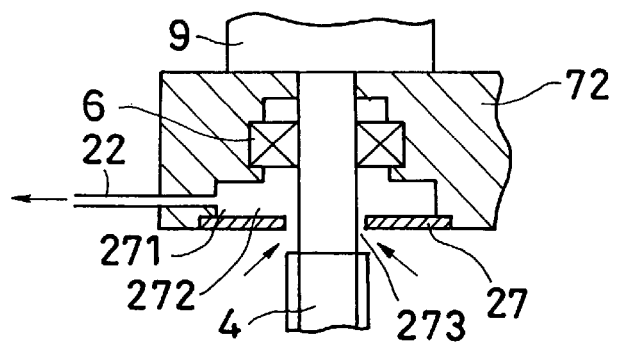
FIG. 5 is an enlarged longitudinal sectional view of Part C in FIG. 2.

As is shown in FIG. 5, the base 72 is formed with a concavity 271 within which the bearing 6 is mounted. The base 72 is provided, at the side of opening end of the concavity 271, with a cover 27 for covering the concavity 271 and the bearing 6. The local exhaust line 22 is communicated with a space 272 covered with the cover 27. A clearance 273 is defined between the cover 27 and the ball screw 4.

At local exhaust portions of the bearings 7 and 6, $N_2$ gas is flowed into the spaces 252 and 272 covered with the covers 25 and 27 through the clearances 253 and 273, respectively, and is exhausted through the local exhaust lines 20 and 22, respectively.

By minimizing the sizes of the clearance 26 between the cover 26 and the ball screw 4 and the clearance 263 between the cover 26 and the guide 5 at the local exhaust portion of the moving block 3, the size of the clearance 253 between the cover 25 and the ball screw 4 at the local exhaust portion of the bearing 7, and the side of the clearance 273 between the cover 27 and the ball screw 4 at local exhaust portions of the bearing, as small as possible, it is possible to increase the flow rate of $N_2$ gas flowing into the spaces 252, 261 and 272 covered with the covers 25, 26 and 27, respectively. As a result, it is possible to effectively prevent particles which are generated by the bearings 6, 7 and the nuts 31, 32 from being flowed out from the covers 25, 26 and 27, and to easily exhaust the particles compulsorily from the load lock chamber 1 by the local exhaust lines 20, 21 and 22. In the present embodiment, the size of each of the clearances 262, 263, 253 and 273 is set at 1.5 mm.

When the local exhaust is conducted in this manner, it is possible to effectively and compulsorily exhaust the particles which are generated from dust generating portions of the moving mechanism such as bearings 6, 7 and nuts 31, 32 which are generation sources of particles. Further, when the covers 25, 26 and 27 are provided for covering such dust generating portions, and the spaces 252, 261 and 272 covered with the covers 25, 26 and 27, are locally exhausted by means of the local exhaust lines 20, 21 and 22, it is possible to easily and compulsorily exhaust the particles generated from the dust generating portions, by means of a simple structure of a cover.

Further, when the moving mechanism includes a shaft and a bearing in the above described manner, when the cover covering the bearing and forming the clearance between the bearing and the shaft, a movement of the bearing is not hindered and it is possible to increase the flow rate of gas which is passed through the clearance and flowed into the space covered by the cover. As a result, it is possible to effectively prevent, the particles generated from the dust generating portions such as bearings, from flowing out of the cover, and the particles can be exhausted easily and compulsorily by the local exhaust lines.

In the present embodiment, the single vacuum pump 80 is used as a vacuum pump for the local exhaust line 23, a vacuum pump for exhausting the inside of the load lock chamber 1, and a vacuum pump for exhausting the inside of the reaction oven 19. Therefore, manufacturing cost can be lowered and the entire system can be simplified.

Figure 6:
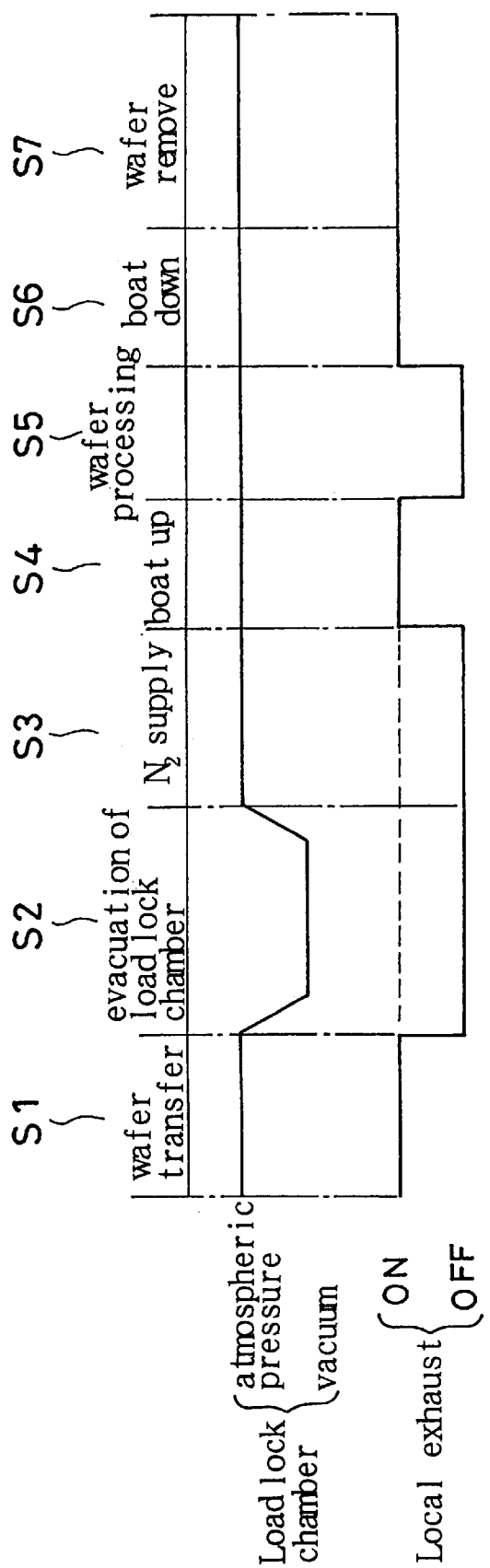
FIG. 6 is a sequence diagram for explaining the operational sequence of the semiconductor manufacturing device according to the one embodiment of the invention.

Next, a method for forming a film on the semiconductor wafer 101 using the above described semiconductor manufacturing apparatus 100 will be explained with reference to FIG. 6. The air valves 13, 15, 24, 123 and the flow meters 118, 132, 201, 211, 221 are controlled by the control device 150. Flow rate information from the flow meters 118, 132, 201, 211, 221, as well as pressure information from the pressure gauge 41 are displayed by the display device 151 through the control device 150.

(Step S1)

First, an interior of the reaction oven 19 is kept at a predetermined temperature and atmosphere in a state where the gate valve 18 is closed. The gate valve 17 is opened. At that time, the air valves 13 and 15 are closed. The air valve 24 is opened. Local exhaust is conducted while controlling the flow rates of the local exhaust lines 20, 21, 22 by means of the flow meters 201, 211, 221 to the predetermined values, respectively. During that time, a plurality of semiconductor wafers 101 are mounted on the boat 10 from the atmosphere of atmospheric pressure outside the load lock chamber 1 through the opening 91 and the gate valve 17.

(Step S2)

After that, the gate valve 17 is closed and the air valve 24 is closed to stop the local exhaust effected by the local exhaust lines 20, 21, 22. The air valve 15 is kept closed, and the air valve 13 is opened to evacuate the load lock chamber 1 through the vacuum exhaust lines 121 and 120.

(Step S3)

Thereafter, the air valve 13 is closed, and $N_2$ gas is supplied from the $N_2$ gas supply line 11 into the load lock chamber 1 until the pressure within the load lock chamber 1 becomes equal to or greater than the atmospheric pressure, so as to bring the interior of the load lock chamber 1 into $N_2$ gas atmosphere. Then, the air valve 15 is opened in a state where $N_2$ gas is kept supplied from the $N_2$ gas supply line 11, and $N_2$ gas is exhausted from the atmospheric pressure vent line 14.

At that time, in order to prevent backward flow of particles or oxygen from the atmospheric pressure vent line 14, the flow rate of $N_2$ gas supplied from the $N_2$ gas supply line 11 is controlled such that the interior of the load lock chamber 1 becomes slightly greater (around 0.05 kfg/cm$^2$G) than the atmospheric pressure. The control of the flow rate of the flow meter 118 is conducted by the control device 150 in accordance with the pressure information within the load lock chamber 1 which is input from the pressure gauge 41.

(Step S4)

Then, the local exhaust by the local exhaust lines 20, 21, 22 is started, and $N_2$ gas is exhausted from the local exhaust lines 20, 21, 22 and the atmospheric pressure vent line 14, while supplying $N_2$ gas from the $N_2$ gas supply line 11. In this state, the gate valve 18 is opened, and the boat 10 is lifted by the moving mechanism 2 to introduce the boat 10 into the reaction oven 19.

When $N_2$ gas is exhausted from the local exhaust lines 20, 21, 22 and the atmospheric pressure vent line 14, while supplying $N_2$ gas from the $N_2$ gas supply line 11, as described above, it is preferable to set the pressure in the load lock chamber 1 slightly greater than pressure at the side of the atmospheric pressure vent line 14 (which is substantially equal to atmospheric pressure), for example, greater than the atmosphere pressure by about 0.05 kfg/cm$^2$G, in order to prevent backward flow of particles or oxygen from the atmospheric pressure vent line 14.

However, because the load lock chamber 1 is evacuated by the local exhaust lines 20, 21, 22, if the vacuum is excessively drawn by the local exhaust lines 20, 21, 22, there is fear that the pressure within the load lock chamber 1 may be reduced to be lower than the atmospheric pressure and the backward flow from the side of the atmospheric pressure vent 14 may be generated, and as a result, the interior of the load lock chamber 1 may be contaminated by particles, oxygen or the like.

For this reason, when the local exhaust is conducted, pressure within the load lock chamber 1 is adjusted to be slightly greater than the atmospheric pressure. A preferable method for adjusting the pressure within the load lock chamber 1 is to provide the flow meter in the local exhaust line 23 and to adjust the flow rate of the local exhaust line. More preferable method is to also provide another flow meter in the $N_2$ gas supply line 11 to adjust flow rates of both the $N_2$ gas supply line 11 and the local exhaust line 23.

It is also possible to adjust the pressure within the load lock chamber 1 by providing a flow meter 140 in the atmospheric pressure vent line 14 to adjust the flow rate of the atmospheric vent line 14.

In this manner, the pressure within the load lock chamber 1 can be conducted by adjusting the flow rate of at least one of the local exhaust line 23, the $N_2$ gas supply line 11 and the atmospheric pressure vent line 14. However, in order to adjust the pressure within the load lock chamber 1, two of the above three flow rates, i.e., for example, flow rates of the $N_2$ gas supply line 11 and the local exhaust line 23 may be adjusted as in the present embodiment, or all of the three flow rates may be adjusted.

When there exist a plurality of portions to be locally exhausted, and a plurality of local exhaust lines are correspondingly provided for such plurality of local exhaust portions, exhaust amounts of the plurality of local exhaust lines are different from one another because of different length and different exhausting resistance of each the local exhaust line. In such a case, if the flow meters 201, 211 and 221 are respectively disposed on the local exhaust lines 20, 21 and 22 as in the present embodiment, it is possible to independently adjust and measure the exhaust amounts of the plurality of local exhaust lines 20, 21 and 22, and the exhaust can be conducted reliably.

Further, when any of the local exhaust lines 20, 21 and 22 is bent by an action of a driving section or an influence from outside and the like, the local exhaust line can not conduct the local exhaust and as a result particles existing at upstream of the bent portion scatter. If such accident is left as it is, the yield is largely lowered. Therefore, in the present embodiment invention, the exhaust amounts of the local exhaust lines 20, 21 and 22 are measured by the flow meters 201, 211 and 211, respectively, and the measured exhaust amounts are compared with predetermined exhaust amounts, respectively, so that not only the flow rates of the local exhaust lines 20, 21 and 22, but also other information concerning whether or not the exhaust amounts of each of the local exhaust lines 20, 21 and 22 are normal or lowered are displayed on the display device 151 so as to constantly monitor the local exhausting state.

With the above arrangement, an abnormality in each of the local exhaust lines 20, 21 and 22 can immediately be detected independently. In the present embodiment, flexible Teflon tubes are used for the local exhaust lines 20, 21 and 22. Because such local exhaust lines 20, 21 and 22 are prone to be bent, it is especially important to monitor the flow rates thereof.

As described above, according to the present embodiment, an effective gas flow can be realized by adjusting the exhaust amount by the flow meters 201, 211 and 221, and by controlling the flow rate of the $N_2$ gas supply line 11. At that time, in general, the exhaust amounts of the local exhaust lines 20, 21 and 22 are set to be at constant values by the flow meters 201, 211 and 221, respectively, and $N_2$ gas of the flow rate greater than a sum of exhaust amounts of the local exhaust lines 20, 21 and 22 is supplied from the $N_2$ gas supply line 11 to exhaust such $N_2$ gas from the local exhaust line 20, 21 and 22 and the atmospheric vent line 14. In the present embodiment, after the interior of the load lock chamber 1 becomes $N_2$ atmosphere, the supply amount of $N_2$ gas from the $N_2$ gas supply line 11 is set at 20l/min, and the exhaust amount of each of the local exhaust line 20, 21 and 22 is set at 5l/min.

When the gate valve 18 is opened, information from the pressure gauge 41 concerning pressure within the load lock chamber 1 is input to the control device 150, the measured pressure value within the load lock chamber 1 is compared with a predetermined value or a pressure value within the reaction oven 19, and the flow meters 118, 201, 211 and 221 are controlled by the control device 150, thereby controlling the pressure within the load lock chamber 1 such that a difference between pressure within the reaction oven 19 and pressure within the load lock chamber 1 is minimized to the utmost.

(Step S5)

Thereafter, the gate valve 18 is closed. And the air valve 24 is closed to stop the local exhaust. $N_2$ gas is supplied from the $N_2$ gas supply line 11 into the load lock chamber 1, and from which $N_2$ gas is exhausted through the atmospheric pressure vent line 14.

At that time, in order to prevent the backward flow of particles or oxygen from the atmospheric pressure vent line 14, the flow rate of $N_2$ gas supplied from the $N_2$ gas supply line 11 by the flow meter 118 is controlled such that pressure within the load lock chamber 1 becomes slightly greater (around 0.05 kfg/cm$^2$G) than atmospheric pressure.

In the reaction oven 19, a film formation processing of the wafer 101 is carried out. As conditions of such a film formation, it is important to strictly control the temperature and pressure within the reaction oven 19.

In the present embodiment, $N_2$ ballast method is employed as a method for pressure control. The $N_2$ ballast method is a method in which the gas-exhausting is conducted while keeping an exhaust capability of the vacuum pump 80 constant, allowing $N_2$ gas to enter from the $N_2$ ballast piping 131 which is connected to an intermediate portion of the vacuum exhaust line 122, and the flow rate of the $N_2$ gas is controlled by the flow meter 132, thereby adjusting the exhaust amount from the reaction oven 19 to adjust the pressure in the reaction oven 19.

In this manner, the pressure within the reaction oven 19 is strictly adjusted by adjusting the exhausting capability from the reaction oven 19 by the vacuum exhaust line 122. Therefore, during formation of film within the reaction oven 19, if the exhausted gas from the local exhaust line 23 is left flowing into the vacuum exhaust line, a variation in the flow rate of the local exhaust line 23 and the like affects the vacuum exhaust line 122 to vary the exhaust conductance of the vacuum exhaust line 122. As a result, pressure within the reaction oven 19 is varied. Therefore, the local gas-exhausting is not conducted during the film formation processing in the reaction oven 19.

On the other hand, if the local gas-exhausting is stopped as described above, because the wafers 101 and the boat 10 exist within the reaction oven 19, such wafers 101 and the boat 10 are not contaminated.

Incidentally, when the gas-exhausting is conducted in the load lock chamber 1 rather than in the reaction oven 19, because the load lock chamber 1 has the same atmosphere as the local exhaust portions and the pressure control is not conducted, and therefor, the local gas-exhausting and a gas-exhausting within the load lock chamber 1 can be conducted simultaneously.

In the above description, although the $N_2$ ballast method has been employed as a method for the pressure control in the reaction oven 19, another method (APC method) using a flow rate adjusting valve can alternatively be used. The APC method is a method in which $N_2$ gas is not introduced, a flow rate adjusting valve 160 is provided in the vacuum exhaust line 122, and the conductance of the vacuum exhaust line 122 is adjusted by adjusting the opening degree of the flow rate adjusting valve 160, thereby adjusting the pressure within the reaction oven 19.

(Step S6)

After the film formation processing in the reaction oven 19 is completed, the atmosphere in the reaction oven 1 is brought into $N_2$ atmosphere.

On the other hand, the air valve 24 is opened to conduct the local exhausting by the local exhaust lines 20, 21 and 22. At that time, $N_2$ gas is supplied from the $N_2$ gas supply line 11 into the load lock chamber 1, and the $N_2$ gas is exhausted from the local exhaust lines 20, 21, 22 and the atmospheric pressure vent line 14. In this state, the gate valve 18 is opened, and the boat 10 is lowered by the moving mechanism 2 to move the boat 10 from the reaction oven 19 into the load lock chamber 1. After that, the gate valve 18 is closed.

When $N_2$ gas is exhausted from the local exhaust lines 20, 21, 22 and the atmospheric pressure vent line 14, while supplying $N_2$ gas from the $N_2$ gas supply line 11 in this manner, in order to prevent the backward flow of particles or oxygen from the atmospheric pressure vent line 14, pressure within the load lock chamber 1 is set slightly greater, i.e., around 0.05 $kgf/cm^2G$, than pressure at the vent side (substantially equal to atmospheric pressure).

Further, when the gate valve 18 is opened, it is preferable to control the pressure within the load lock chamber 1 by controlling the flow rates of the flow meters 118, 201, 211 and 221 such as to minimize a difference between pressure within the reaction oven 19 and pressure within the load lock chamber 1.

(Step S7)

Next, the local gas-exhausting from the local exhaust lines 20, 21 and 22 is continued, and $N_2$ gas is exhausted from the atmospheric pressure vent line 14 while supplying $N_2$ gas from the $N_2$ gas supply line 11, the gate valve 17 is opened, and a plurality of semiconductor wafers 101 are taken out from the boat 10 through the opening 91 and the gate valve 17 into the atmosphere outside the load lock chamber 1.

When the gate valve 17 is opened, it is also preferable to control the pressure within the load lock chamber 1 by controlling the flow rates of the flow meters 118, 201, 211 and 221, such as to minimize a difference between the pressure within the load lock chamber 1 and the atmospheric pressure outside the load lock chamber 1.

According to the present embodiment, inside of the moving mechanism chamber 52 in which the moving mechanism 2 is provided can be kept clean.

Therefore, when the moving block 3 is moved, it is possible to prevent particles generated from the bearings 6, 7 of the moving mechanism 2, the nut 31 of the ball screw 4, and the nut 32 of the guide 5 from being diffused into the boat chamber 51. Further, even if an amount of particles generated by increasing the moving speed of the moving block 3 is increased, it is possible to prevent such particles from being diffused into the boat chamber 51.

Furthermore, at the time of opening or closing of the gate valves 17 and 18, even if a pressure difference is generated between the load lock chamber 1 and the regions partitioned by the gate valves 17, 18, or even if a heat convection is generated when the wafers 101 which has been processed in the reaction oven 19 and the boat 10 are lowered from the reaction oven 19 to the load lock chamber 1, it is possible to prevent particles from being diffused from the slit 116 of the partition plate 16 into the boat chamber 51.

In this manner, in the load lock chamber 1, according to the present embodiment, the boat 10 and the wafers 101 mounted on the boat 10 can be kept clean.

Next, for the purpose of comparison, a description will be made on a semiconductor manufacturing apparatus which is not provided with a local exhaust line as used by the present invention.

Figure 7A:
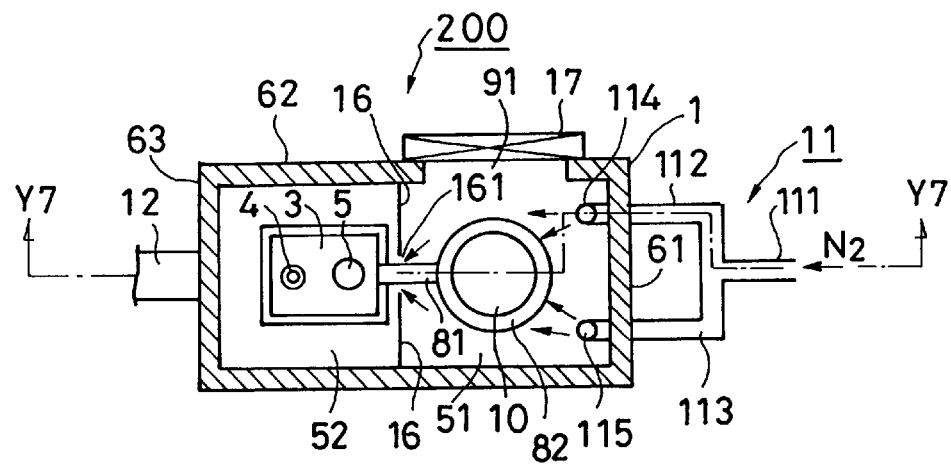
FIG. 7A is a transverse sectional view, taken along the line X7—X7 of FIG. 7B, for explaining a load lock chamber of a semiconductor manufacturing apparatus for comparison.
Figure 7B:
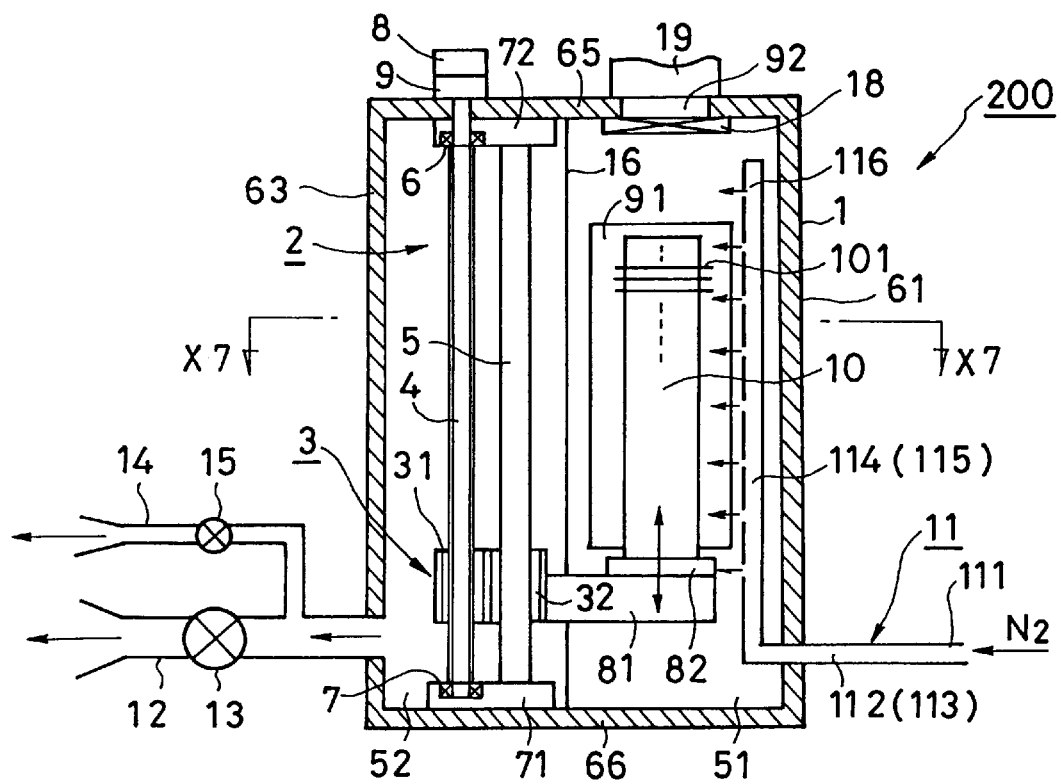
FIG. 7B is a longitudinal sectional view taken along the line Y7—Y7 of FIG. 7A.

Referring to FIGS. 7A and 7B, a semiconductor manufacturing apparatus 200 which will be described for a comparison is provided with a load lock chamber 1 for accommodating a boat 10 on which wafers 101 are mounted. A moving mechanism 2 for lifting or lowering the boat 10 is provided in the load lock chamber 1.

The moving mechanism 2 is mainly composed of a moving block 3, a ball screw 4, a guide 5, bearings 6, 7, a motor 8 and a magnetic seal unit 9.

The load lock chamber 1 is provided with an opening 91 for mounting the wafers 101 on the boat 10 and for taking out the wafers 101 from the boat 10 therethrough, and a gate valve 17 for closing the opening 91. The load lock chamber 1 is also provided with an opening 92 between the load lock chamber 1 itself and a reaction oven 19 for forming a film on the wafers 101 on the boat 10, and with a gate valve 18 for closing the opening 92. A partition plate 16 is provided in the load lock chamber 1 for dividing the chamber 1 into a moving mechanism chamber 52 for accommodating the moving mechanism 2 and a boat chamber 51 for accommodating the boat 10.

Further, connected to the load lock chamber 1 are an N₂ gas supply line 11, a vacuum exhaust line 12, an atmospheric pressure vent line 14, and air valves 13 and 15 for changing over the gas-exhausting lines. The N₂ gas supply line 11 is connected to the upstream of the boat chamber 51, and the vacuum exhaust line 12 and the atmospheric pressure vent line 14 are connected at the downstream of N₂ gas flow in the moving mechanism chamber 52.

First, the interior of the load lock chamber 1 is depressurized by the vacuum exhaust line 12 and then, N₂ gas is supplied from the gas supply line 11 into the load lock chamber 1 until pressure in the load lock chamber 1 becomes equal to the atmospheric pressure so as to replace the atmosphere by the N₂ gas atmosphere within the load lock chamber 1. Further, under the atmospheric pressure, N₂ gas is supplied from the N₂ gas supply line 11 and N₂ gas is exhausted from the atmospheric pressure vent line 14, so as to establish a structure in which particles generated from the bearings 6, 7 of the moving mechanism 2, the nut 31 of the ball screw 4 and the nut 32 of the guide 5 can hardly scatter in the boat chamber 51.

However, with the load lock chamber 1 having a structure of this type, the wafers 101 are contaminated by particles generated from the moving mechanism 2 by the following reasons:

That is, because N₂ gas is supplied from holes 116 provided in the N₂ gas supply pipes 114, 115 of the N₂ gas supply line 11 into the load lock chamber 1 in a shower manner, such N₂ gas does not uniformly flow from the slit 161 of the partition plate 16 toward the moving mechanism chamber 52. Therefore, at the time of movement of the moving block 3, particles generated from the bearings 6, 7 of the moving mechanism 2, the nut 31 of the ball screw 4 and the nut 32 of the guide 5 diffuse from the slit 116 of the partition plate 16 into the boat chamber 51 to contaminate the wafers 101. And when the moving speed of the moving block 3 is increased, the amount of particles generated is abruptly increased, and the wafers 101 are further contaminated by the diffusion of such particles.

Further, particles are diffused from the moving mechanism chamber 52 through the slit 116 of the partition plate 16 into the boat chamber 51 to contaminate the wafers 101, by a pressure difference between the load lock chamber 1 and the regions partitioned by the gate valves 17 and 18 at the time of opening or closing of the gate valves 17 and 18, or by a heat convection generated when the wafers 101 which has been processed in the reaction oven 19 and the boat 10 are lowered from the reaction oven 19 into the load lock chamber 1.

In this way, with the load lock chamber 1 having the structure shown in FIGS. 7A and 7B, it is difficult to eliminate particles generated by the moving mechanism, and there is a problem that the load lock chamber 1 is accessible to a pressure difference at the time of opening or closing of the gate valves and a heat convection by the head-treated wafers, thereby easily diffusing the particles to contaminate the wafers.

Although the above description only explains one embodiment of the present invention, it should be noted that the invention should not be limited to the described embodiment only. For example, in the Steps S2 and S3, although it is described that local gas-exhausting by the local exhaust lines 20, 21 and 22 is stopped, it is possible to continue the local gas-exhausting. When it is unnecessary to take oxidation into consideration, air can be used instead of N₂ gas. Further, in the described embodiment, although a description has been made on the boat 10 on which the wafers 101 are mounted, the present invention is also applicable to a load lock chamber for a cassette in which wafers are mounted. Furthermore, the present invention can also be applied not only to a semiconductor wafer, but also to a load lock chamber for a glass substrate for forming a liquid crystal display device. The invention can be applied not only to a load lock chamber of the type in which the semiconductor wafer or the glass substrate is mounted on a boat or a cassette, but also to a load lock chamber of a single wafer or glass substrate transfer type in which wafers or glass substrates are carried in or out one-sheet by one-sheet. The load lock chamber of the present invention is suitably applied to a semiconductor manufacturing apparatus or a liquid crystal display devise manufacturing apparatus.

As described above, according to the present invention, dust generating portions such as bearing or nut which is a generating source of particles can compulsorily be locally exhausted by the vacuum exhaust line with a simple structure, and particles are restrained from being diffused from the moving mechanism 2, thereby preventing wafers from being contaminated. Further, even there exists a heat convection or pressure difference at the time of opening or closing of a gate valve, wafers can be prevented from being contaminated by the diffusion of particles from the moving mechanism 2. In this case, by making the outside the load lock chamber 1 to be a clean space, the contamination of the wafers can be prevented more effectively.

What is claimed is:

1. A substrate processing apparatus, comprising:
   a substrate processing chamber for processing a substrate;
   a load lock chamber;
   a gas supply for supplying gas into said load lock chamber;
   a chamber exhaust for exhausting said load lock chamber;
   a valve disposed in said chamber exhaust;
   a moving mechanism provided in said load lock chamber for moving said substrate;
   a local exhaust for locally exhausting a dust generating portion of said moving mechanism;
   a flow rate regulator in one of said gas supply, said chamber exhaust and said local exhaust; and
   a controller, wherein
   during movement of said substrate by said moving mechanism, said gas supply supplies gas to said load lock chamber, said valve is opened, said local exhaust exhausts the dust generating portion of said moving mechanism, and said controller controls said flow rate regulator.

2. A substrate processing apparatus as recited in claim 1, further comprising:
   a pressure detector for detecting pressure in said load lock chamber, wherein
   said flow rate regulator is provided in said gas supply and
   said controller is capable of controlling said flow rate regulator according to a signal from said pressure detector.

3. A substrate processing apparatus as recited in claim 1, wherein said flow rate regulator is provided in said local exhaust.

4. A substrate processing apparatus as recited in claim 1, wherein said flow rate regulator is provided in said chamber exhaust.

5. A substrate processing apparatus as recited in claim 4, wherein said chamber exhaust includes an atmospheric vent line, pressure at one end of said atmospheric pressure vent line is substantially equal to the atmospheric pressure, and the other end of said atmospheric pressure vent line is connected with said load lock chamber, and said flow rate regulator is disposed in said atmospheric pressure vent line.

6. A substrate processing apparatus as recited in claim 3, further comprising:

a pressure detector for detecting pressure in said load lock chamber, wherein said controller is capable of controlling said flow rate regulator in accordance with a signal from said pressure detector.

7. A substrate processing apparatus as recited in claim 1, wherein said chamber exhaust includes an atmospheric pressure vent line and a vacuum exhaust line which is to be connected to a vacuum pump, pressure at one end of said atmospheric pressure vent line is substantially equal to the atmospheric pressure and the other end is connected with said load lock chamber, and said local exhaust is connected to said vacuum exhaust line.

8. A substrate processing apparatus as recited in claim 1, wherein said chamber exhaust includes an atmospheric pressure vent line and a vacuum exhaust line which is to be connected to a vacuum pump, pressure at one end of said atmospheric pressure vent line is substantially equal to the atmospheric pressure and the other end is connected with said load lock chamber, and said substrate processing apparatus further includes a first valve disposed at an intermediate portion of said vacuum exhaust line, a second valve disposed at an intermediate portion of said atmospheric pressure vent line and a controller, and said first and second valves are controlled by said controller such that during movement of said substrate by said moving mechanism, said first valve is closed and said second valve is opened.

9. A substrate processing apparatus as recited in claim 8, wherein said local exhaust is connected to said vacuum exhaust line at the downstream side of said first valve.

10. A substrate processing apparatus, comprising:
a substrate processing chamber for processing a substrate;
a load lock chamber;
a gas supply for supplying gas into said load lock chamber;
a chamber exhaust for exhausting said load lock chamber;
a moving mechanism provided within said load lock chamber and capable of moving said substrate;
a local exhaust for locally exhausting a dust generating portion of said moving mechanism;
a flow rate detector for measuring an exhaust amount of said local exhaust; and
a controller, wherein
during movement of said substrate by said moving mechanism, said local exhaust locally exhausts the dust generating portion of said moving mechanism and said controller compares the exhaust amount of said local exhaust with a predetermined exhaust amount to monitor the state of said local exhaust.

11. A substrate processing apparatus as recited in claim 10, having a plurality of said local exhausts, and wherein a flow rate detector is respectively provided in each of said plurality of local exhausts.

12. A substrate processing apparatus as recited in claim 10, wherein said local exhaust comprises a flexible exhaust pipe.

13. A substrate processing apparatus, comprising:
a substrate processing chamber for processing a substrate;
a load lock chamber;
a gas supply for supplying gas into said load lock chamber;
a chamber exhaust connected with said load lock chamber for exhausting said load lock chamber;
a moving mechanism provided within said load lock chamber for moving said substrate;
a first vacuum exhaust line connected to a vacuum pump;
a second vacuum exhaust line connected with said substrate processing chamber and said first vacuum exhaust line;
a local exhaust, connected with said first vacuum exhaust line and not connected with said load lock chamber, for locally exhausting a dust generating portion of said moving mechanism;
a valve connected to an intermediate portion of said local exhaust; and
a valve controller capable of controlling said valve;
wherein during processing of said substrate in said substrate processing chamber, said valve controller controls said valve to be closed.

14. A substrate processing apparatus as recited in claim 1, wherein said gas supply is connected with said load lock chamber at a first region of said load lock chamber in which said substrate moves, and said chamber exhaust is connected with said load lock chamber at a second region of said load lock chamber in which said moving mechanism is provided.

15. A substrate processing apparatus as recited in claim 1, wherein said load lock chamber is coupled to said substrate processing chamber.

16. A substrate processing apparatus as recited in claim 1, further comprising a cover for covering said dust generating portion of said moving mechanism, wherein said cover has an opening through which a space covered with said cover is connected with the inside of said load lock chamber, and said local exhaust is connected with said space covered with said cover and said gas supply and said chamber exhaust are not connected with said space covered with said cover.

17. A substrate processing apparatus, comprising:
a substrate processing chamber for processing a substrate;
a load lock chamber;
a gas supply for supplying gas into said load lock chamber;
a chamber exhaust for exhausting said load lock chamber;
a moving mechanism provided in said load lock chamber and capable of moving said substrate;
a local exhaust capable of locally exhausting a dust generating portion of said moving mechanism;
a flow rate regulator in one of said gas supply, said chamber exhaust and said local exhaust;
a controller; and
a pressure detector for detecting pressure in said load lock chamber, wherein
while locally exhausting said dust generating portion, the inside pressure of the load lock chamber is kept greater than a pressure of said chamber exhaust.

18. A substrate processing apparatus, as recited in claim 17, wherein said inside pressure of the load lock chamber is kept greater than the atmospheric pressure while locally exhausting said dust generating portion.

* * * * *